(12) United States Patent
Cheng et al.

(10) Patent No.: US 12,400,996 B2
(45) Date of Patent: Aug. 26, 2025

(54) HETEROGENOUS BONDING LAYERS FOR DIRECT SEMICONDUCTOR BONDING

(71) Applicant: Taiwan Semiconductor Manufacturing Company, Ltd., Hsinchu (TW)

(72) Inventors: Kuang-Wei Cheng, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,528

(22) Filed: Aug. 10, 2023

(65) Prior Publication Data

US 2023/0402427 A1  Dec. 14, 2023

Related U.S. Application Data

(62) Division of application No. 17/446,549, filed on Aug. 31, 2021, now Pat. No. 12,205,921.

(51) Int. Cl.
*H01L 23/00* (2006.01)
*H01L 25/00* (2006.01)
*H01L 25/065* (2023.01)

(52) U.S. Cl.
CPC ............. *H01L 24/83* (2013.01); *H01L 24/32* (2013.01); *H01L 25/0657* (2013.01);
(Continued)

(58) Field of Classification Search
CPC ......... H01L 24/32; H01L 24/83; H01L 25/50; H01L 25/0657; H01L 2224/83896;
(Continued)

(56) References Cited

U.S. PATENT DOCUMENTS 6,984,571 B1 * 1/2006 Enquist .................. H01L 24/94
257/E21.705
9,177,830 B1 11/2015 Wu et al.
(Continued)

FOREIGN PATENT DOCUMENTS

CN      112563235 A    3/2021
TW      201604979 A    2/2016
(Continued)

*Primary Examiner* — Jasmine J Clark
(74) *Attorney, Agent, or Firm* — Harrity & Harrity, LLP

(57) ABSTRACT

A first semiconductor device and a second semiconductor device may be directly bonded using heterogeneous bonding layers. A first bonding layer may be formed on the first semiconductor device and the second bonding layer may be formed on the second semiconductor device. The first bonding layer may include a higher concentration of hydroxy-containing silicon relative to the second bonding layer. The second bonding layer may include silicon with a higher concentration of nitrogen relative to the first bonding layer. An anneal may be performed to cause a dehydration reaction that results in decomposition of the hydroxy components of the first bonding layer, which forms silicon oxide bonds between the first bonding layer and the second bonding layer. The nitrogen in the second bonding layer increases the effectiveness of the dehydration reaction and the effectiveness and strength of the bond between the first bonding layer and the second bonding layer.

20 Claims, 16 Drawing Sheets

(52) U.S. Cl.
CPC .... *H01L 25/50* (2013.01); *H01L 2224/32145* (2013.01); *H01L 2224/83896* (2013.01); *H01L 2924/05042* (2013.01); *H01L 2924/0509* (2013.01); *H01L 2924/05442* (2013.01); *H01L 2924/0549* (2013.01)

(58) Field of Classification Search
CPC ... H01L 2224/32145; H01L 2924/0509; H01L 2924/05442; H01L 2924/0549; H01L 2924/05042
USPC ........................................................ 257/777
See application file for complete search history.

(56) References Cited

U.S. PATENT DOCUMENTS

| | | |
|---|---|---|
| 10,698,156 B2 | 6/2020 | Coolbaugh et al. |
| 11,183,477 B2 | 11/2021 | Liff et al. |
| 11,417,660 B2 | 8/2022 | Park |
| 12,021,072 B2 * | 6/2024 | Hannebauer ........ H01L 25/0657 |
| 2020/0006285 A1 | 1/2020 | Wang et al. |
| 2023/0065793 A1 | 3/2023 | Cheng et al. |
| 2023/0066395 A1 | 3/2023 | Hsu et al. |

FOREIGN PATENT DOCUMENTS

| | | |
|---|---|---|
| TW | 201910832 A | 3/2019 |
| TW | 202109839 A | 3/2021 |

\* cited by examiner

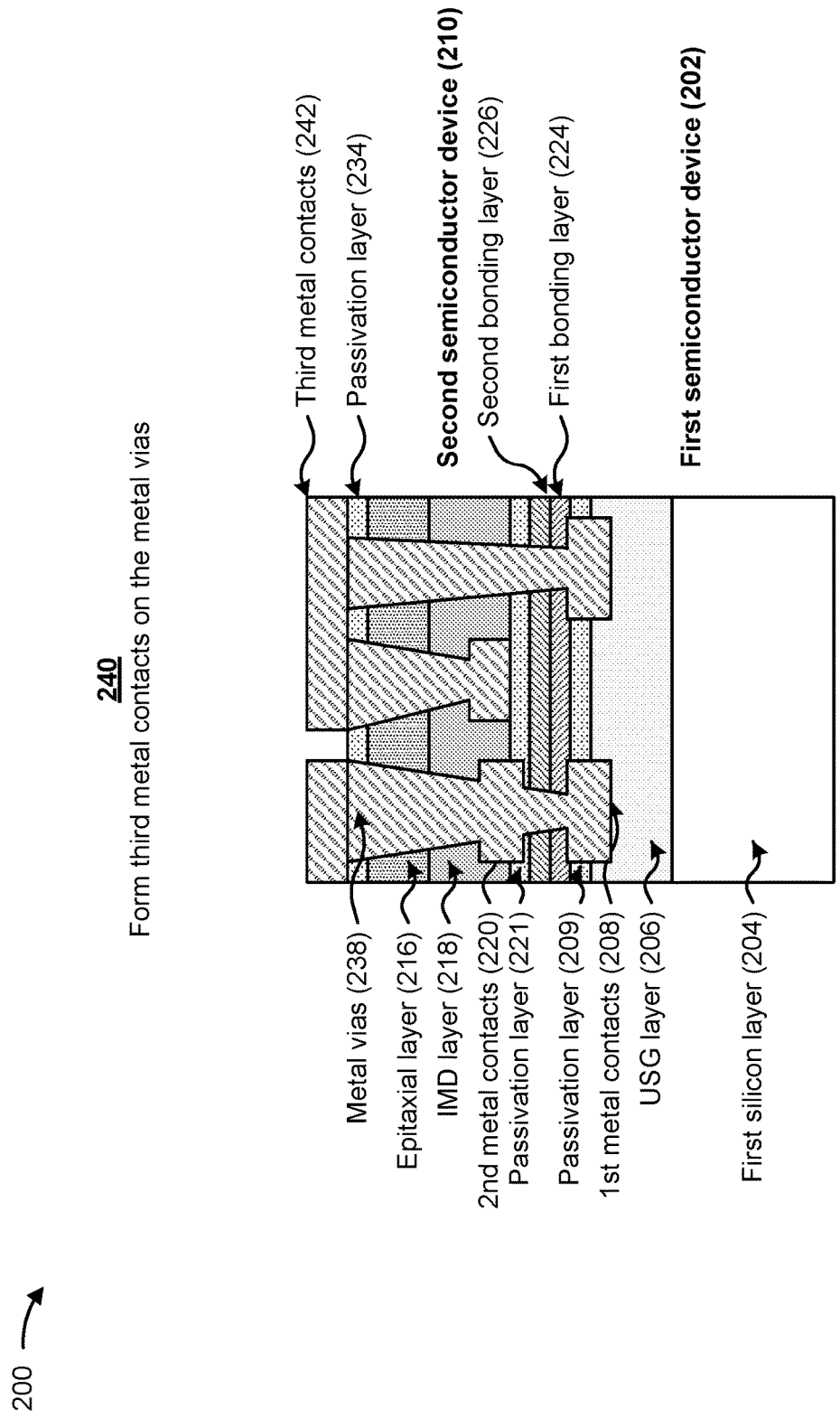

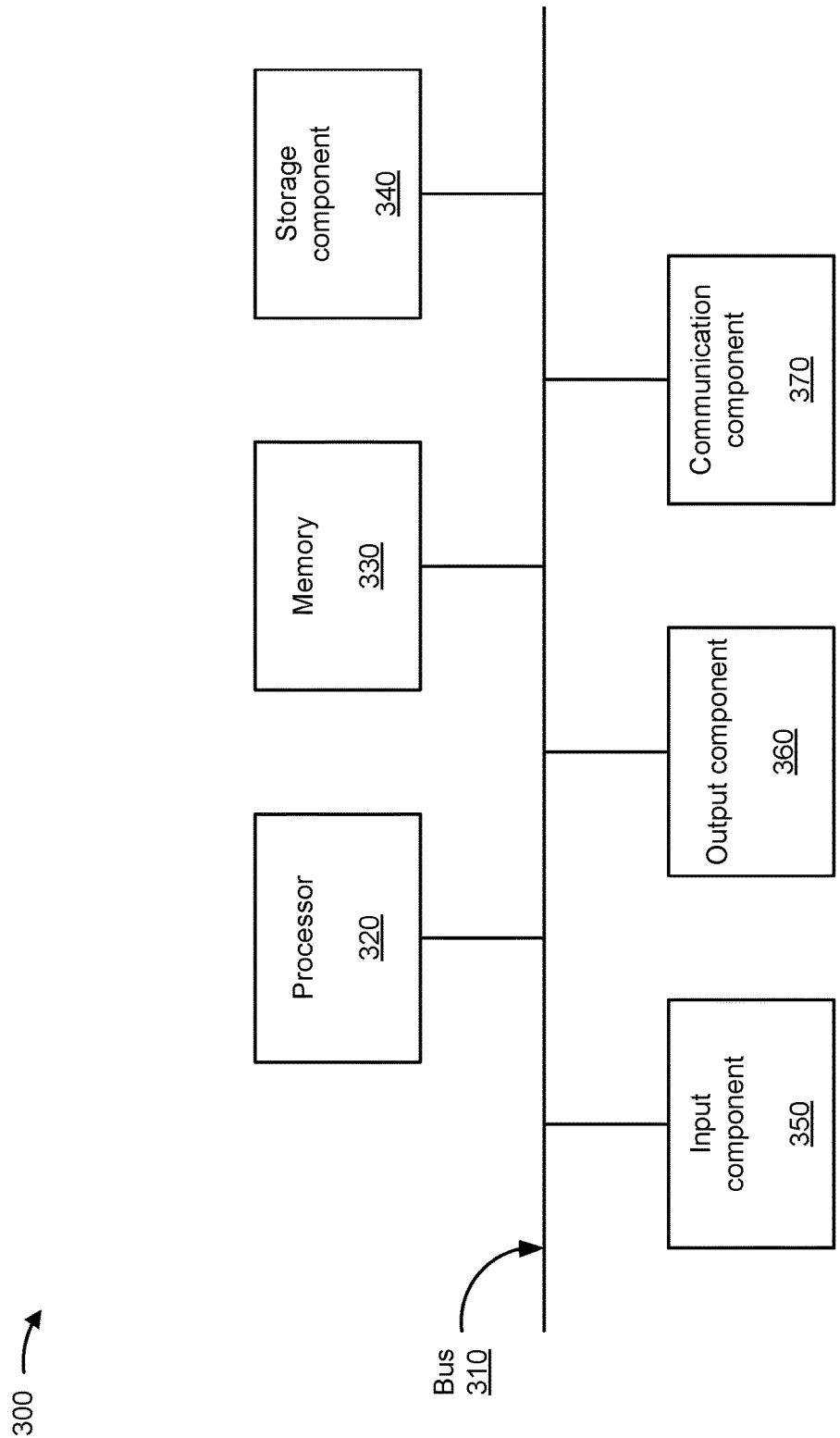

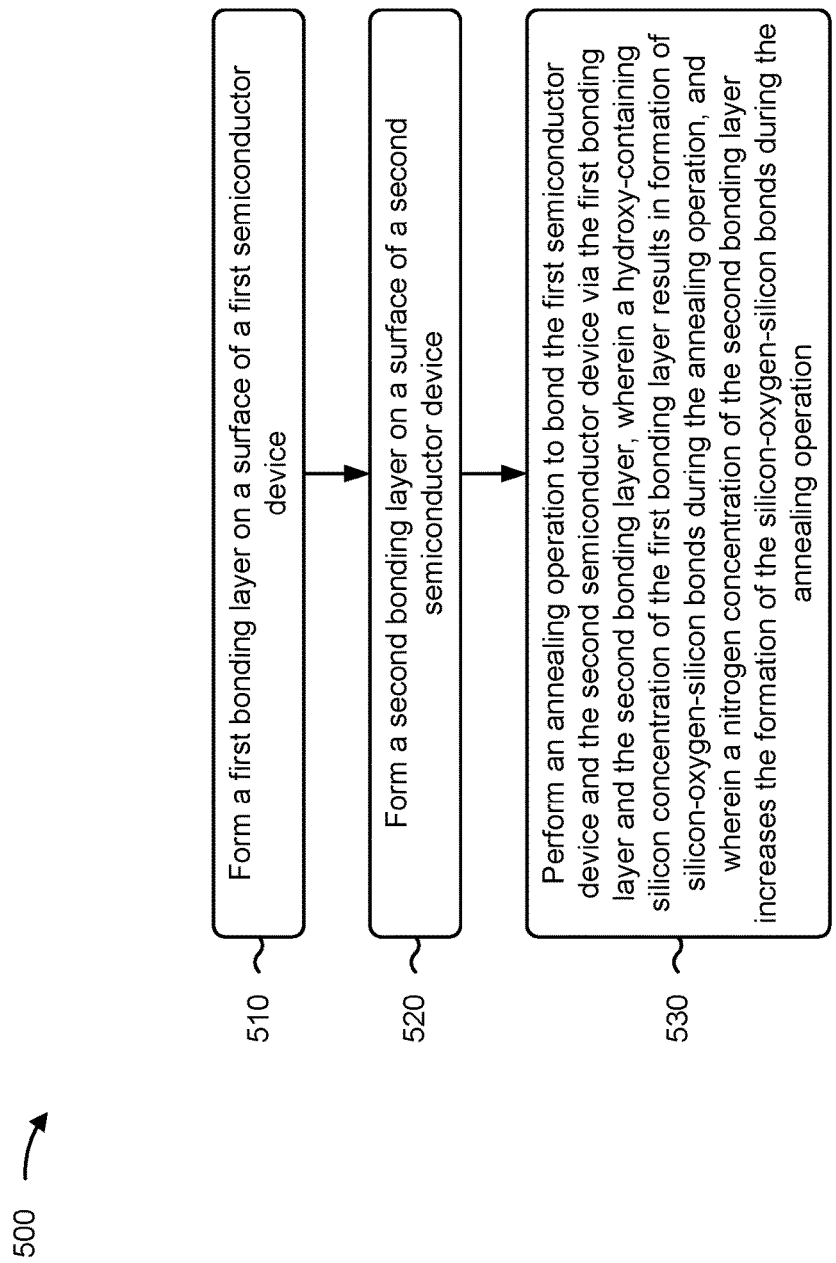

HETEROGENOUS BONDING LAYERS FOR DIRECT SEMICONDUCTOR BONDING

RELATED APPLICATION

This application is a continuation of U.S. patent application Ser. No. 17/446,549, filed Aug. 31, 2021, which is incorporated herein by reference in its entirety.

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are diagrams of one or more example operations involved in manufacturing an example semiconductor device described herein.

FIG. 3 is a diagram of example components of one or more tools and/or devices of FIG. 1 described herein.

FIGS. 4 and 5 are flowcharts of example processes for joining semiconductor devices described herein.

DETAILED DESCRIPTION

Figure 1:
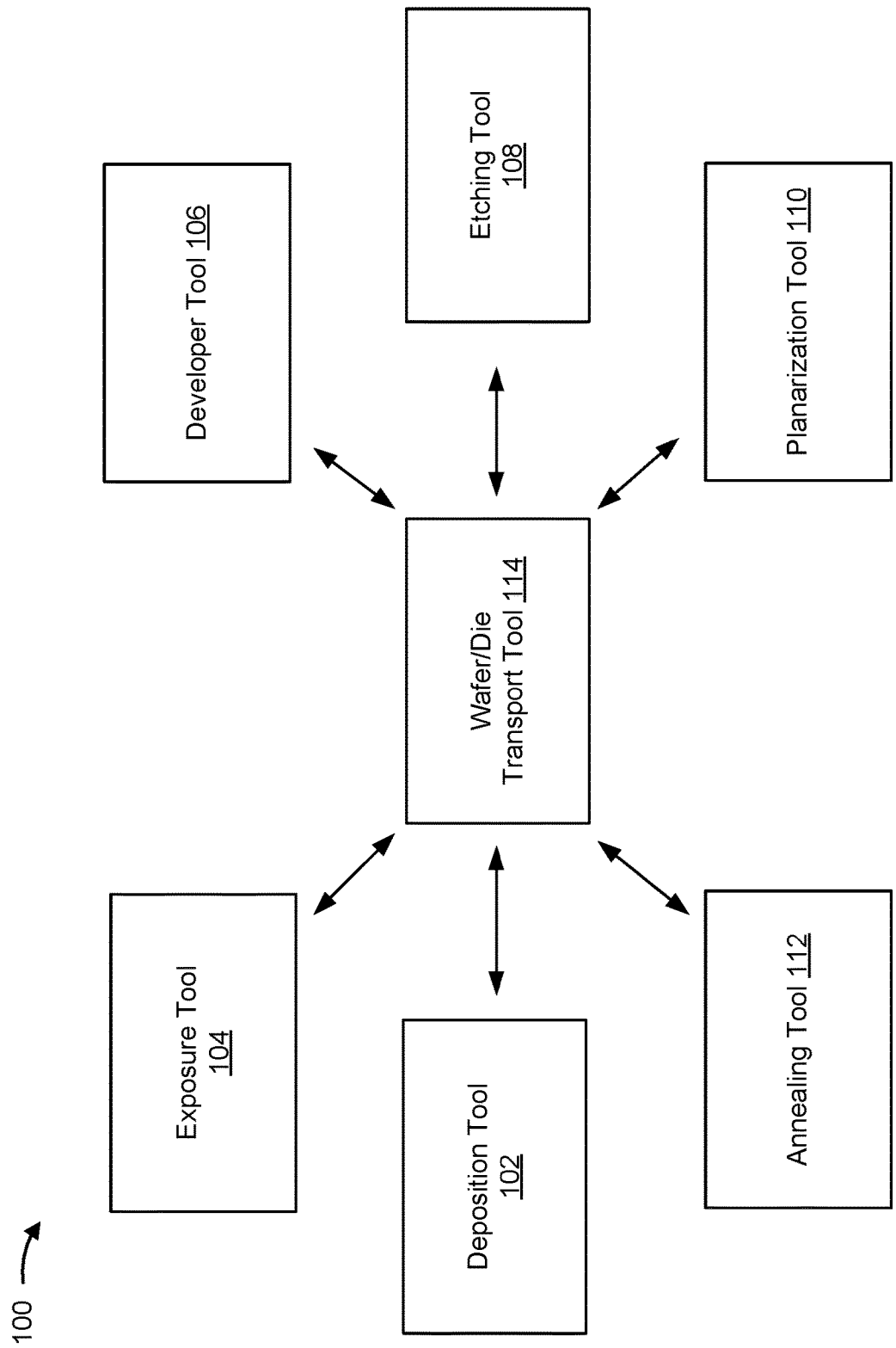
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various bonding techniques may be used to bond a first semiconductor device with a second semiconductor device, such as direct bonding, chemically activated bonding, plasma activated bonding, anodic bonding, eutectic bonding, glass frit bonding, adhesive bonding, thermo-compressive bonding, and reactive bonding, among other examples. Some bonding techniques involve the use of a plasma pretreatment technique. Plasma pretreatment includes using a plasma (e.g., a nitrogen-based plasma or another type of plasma) to pretreat one or more bonding films to promote adhesion between the first semiconductor device and the second semiconductor device. Such bonding techniques may include several costly and time-consuming processing techniques.

Some implementations described herein provide techniques and apparatuses for direct bonding of two semiconductor devices using heterogeneous bonding layers. In some implementations, a first bonding layer may be formed on a first semiconductor device and a second bonding layer may be formed on a second semiconductor device that is to be bonded or joined to the first semiconductor device. Each bonding layer may include a silicon-containing material. The first bonding layer may include a higher concentration of hydroxy-containing silicon (silicon bonded with a hydroxy, which may include an oxygen atom bonded to a hydrogen atom (OH)) and a lower concentration of nitrogen relative to the second bonding layer. The second bonding layer may include silicon with a higher concentration of nitrogen relative to the first bonding layer.

A dry anneal may be performed to bond or fuse the first bonding layer and the second bonding layer. A dehydration reaction occurs between the first bonding layer and the second bonding layer during the dry anneal. The dehydration reaction results in decomposition of the hydroxy components of the first bonding layer, which forms silicon oxide bonds between the first bonding layer and the second bonding layer. Here, the silicon and the oxygen in silicon-hydroxy (Si—OH) of the first bonding layer bonds with the silicon in the second bonding layer to form Si—O—Si bonds, with water forming a byproduct of the dehydration reaction (e.g., the hydrogen and oxygen atoms in the Si—OH form $H_2O$). In this way, the first semiconductor device and the second semiconductor device may be directly bonded without the use of a plasma pretreatment process, which decreases a cost and a complexity of the bonding process. Moreover, the nitrogen in the second bonding layer increases the effectiveness of the dehydration reaction and, therefore, the effectiveness and strength of the bond between the first bonding layer and the second bonding layer.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etching tool 108, a planarization tool 110, an annealing tool 112, and/or another type of semiconductor processing tool. The plurality of semiconductor processing tools 102-112 included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etching tool 108 may include a wet etching tool, a dry etching tool, and/or the like. In some implementations, the etching tool 108 includes a chamber that is filled with an etchant, and the substrate is placed in the chamber for a particular time period to remove particular amounts of one or more portions of the substrate. In some implementations, the etching tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

The annealing tool 112 is a semiconductor processing tool that includes a semiconductor processing chamber and one or more devices capable of heating a semiconductor device. For example, the annealing tool 112 may include a rapid thermal anneal (RTA) tool, a dry annealing tool, or another type of annealing tool that is capable of heating a semiconductor device to cause a reaction between two or more materials or gasses, to cause a material to decompose, to bond two or more semiconductor devices, and/or the like.

Wafer/die transport tool 114 includes a mobile robot, a robot arm, a tram or rail car, and/or another type of device that are used to transport wafers and/or dies between semiconductor processing tools 102-112 and/or to and from other locations such as a wafer rack, a storage room, and/or the like. In some implementations, wafer/die transport tool 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the environment 100 may perform one or more functions described as being performed by another set of devices of the environment 100.

FIGS. 2A-2G are diagrams of one or more example operations 200 involved in manufacturing an example device described herein. The device may include a logic device, a memory device, a finFET, a MOSFET, an integrated circuit, a processor, a sensor, another type of semiconductor or electronic device, or a portion thereof. The example operations 200 illustrated and described in connection with FIGS. 2A-2G may be performed as part of a bonding process to bond two or more semiconductor devices of the device.

Figure 2A:
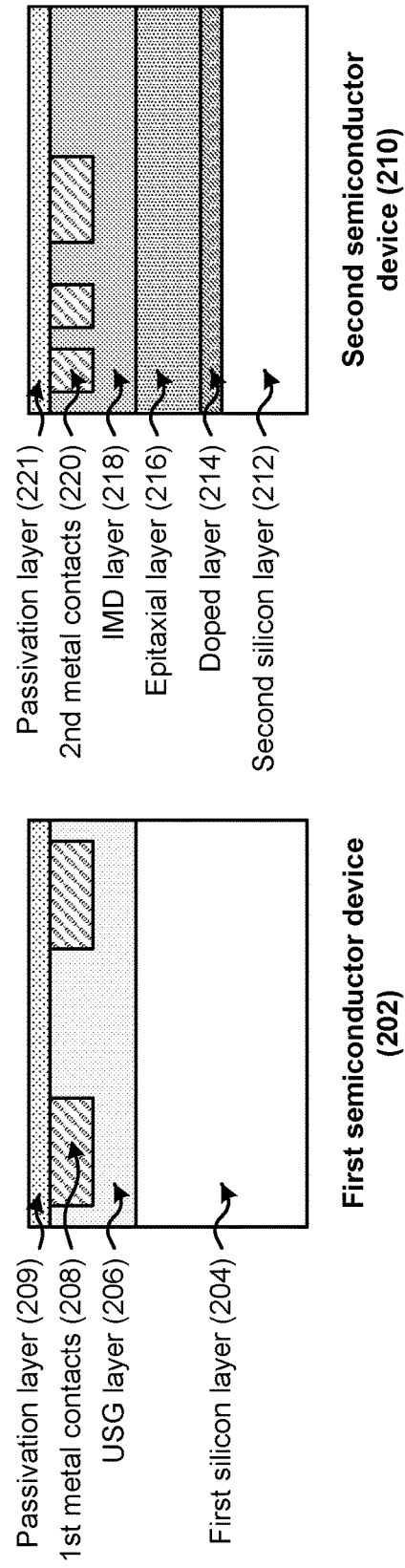

As shown in FIG. 2A, the device may include a first semiconductor device 202. The first semiconductor device 202 may include a first silicon layer 204, an undoped silicate glass (USG) layer 206 provided on the first silicon layer 204, first metal contacts 208 formed in the USG layer 206, and a passivation layer 209 formed on the USG layer 206 and the first metal contacts 208. The first semiconductor device 202 may include a semiconductor wafer, a semiconductor die, and/or the like.

The first silicon layer 204 may include a silicon wafer sliced from a silicon crystal ingot grown as a cylinder. The first silicon layer 204 may include an electrical conductivity value falling between that of a conductor, such as metallic copper, and an insulator, such as glass. The first silicon layer 204 may be replaced with other materials, such as germanium, gallium arsenide, silicon germanium, and/or the like.

The USG layer 206 may include an undoped silicate glass that protects and isolates elements of the first semiconductor device 202. The USG layer 206 may include a high deposition rate at low temperatures, and may include similar properties to silicon dioxide. The USG layer 206 may be utilized as an insulator and passivation layer in multilevel interlevel dielectric devices (e.g., to electrically insulate the first metal contacts 208 from other components of the first semiconductor device 202). In some implementations, the deposition tool 102 of the environment 100, described above in connection with FIG. 1, may be utilized to form the USG layer 206 on a top surface of the first silicon layer 204. For example, deposition tool 102 may perform a PECVD operation, an HDP-CVD operation, an SACVD operation, an ALD operation, a PVD operation, or another deposition operation to deposit the USG layer 206 on the top surface of the first silicon layer 204.

The first metal contacts 208 may include a conductive metal, such as titanium, cobalt, tungsten, aluminum, copper, ruthenium, iridium, and/or the like. In some implementations, the first metal contacts 208 may be formed within openings formed in the USG layer 206. In some implementations, the deposition tool 102 of the environment 100, described above in connection with FIG. 1, may be utilized to perform a deposition operation that forms the first metal contacts 208 in the openings of USG layer 206. In some implementations, a plating tool is used to form the first metal contacts 208 in the USG layer 206. In these examples, the plating tool may perform a plating operation to form the first metal contacts 208. Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate (e.g., the USG layer 206). The plating solution reaches the USG layer 206 and deposits plating material ions into the openings in the USG layer 206 to form the first metal contacts 208.

In some implementations, one or more semiconductor processing tools of the environment 100, described above in connection with FIG. 1, may be utilized to form the openings in the USG layer 206, prior to formation of the first metal contacts 208 in the openings. For example, the deposition tool 102 may form a photoresist layer on the USG layer 206, the exposure tool 104 may expose the photoresist layer to a radiation source to pattern the photoresist layer, the developer tool 106 may develop and remove portions of the photoresist layer to expose the pattern, and the etching tool 108 may etch the one or more portions of the USG layer 206 to form the openings in the USG layer 206. In some implementations, a photoresist removal tool removes the remaining portions of the photoresist layer (e.g., using a chemical stripper and/or another technique) after the etching tool 108 etches the USG layer 206.

The passivation layer 209 may include an oxide material (e.g., a metal oxide) that is inert and does not change semiconductor properties as a result of interaction with air or other materials in contact with the passivation layer 209. The passivation layer 209 may allow electricity to reliably penetrate to conducting layers provided below the passivation layer 209, and to overcome surface states that prevent electricity from reaching the conducting layers. In some implementations, the deposition tool 102 of the environment 100, described above in connection with FIG. 1, may be utilized to form the passivation layer 209 on the top surface of the USG layer 206 and the first metal contacts 208.

As further shown in FIG. 2A, the device may include a second semiconductor device 210. The second semiconductor device 210 may include a second silicon layer 212, a doped layer 214 provided on the second silicon layer 212, an epitaxial layer 216 formed on the doped layer 214, an intermetal dielectric (IMD) layer 218 formed on the epitaxial layer 216, second metal contacts 220 formed in the IMD layer 218, and a passivation layer 221 formed on the IMD layer 218 and the second metal contacts 220. The second semiconductor device 210 may include a semiconductor wafer, a semiconductor die, and/or the like.

The second silicon layer 212 may include a silicon wafer sliced from a silicon crystal ingot grown as a cylinder. The second silicon layer 212 may include an electrical conductivity value falling between that of a conductor, such as metallic copper, and an insulator, such as glass. The second silicon layer 212 may be replaced with other materials, such as germanium, gallium arsenide, silicon germanium, and/or the like.

The doped layer 214 may include a material (e.g., silicon, germanium, silicon carbide, silicon germanium, and/or the like) that is doped with a dopant material (e.g., boron, arsenic, phosphorus, gallium, and/or the like). Doping is the intentional introduction of impurities into an intrinsic semiconductor material for the purpose of modulating electrical, optical, and/or structural properties of the semiconductor material. In some implementations, the deposition tool 102 of the environment 100, described above in connection with FIG. 1, may be utilized to perform a deposition operation that forms the intrinsic semiconductor material on a top surface of the second silicon layer 212. An ion implantation tool or a diffusion tool may also be utilized to implant the dopant material in the intrinsic semiconductor material to form the doped layer 214.

The epitaxial layer 216 may include a silicon germanium formed via epitaxial growth. In some implementations, the epitaxial layer 216 includes other materials, such as silicon, silicon carbide, silicon germanium, gallium arsenide, gallium phosphide, and/or the like. In some implementations, the deposition tool 102 of the environment 100, described above in connection with FIG. 1, may be utilized to perform a deposition operation that forms the epitaxial layer 216 on a top surface of the doped layer 214.

The IMD layer 218 may include an intermetal dielectric material, such as silicon dioxide, a low dielectric constant (e.g., k values in a range of 3.2 to 2.0) dielectric material, fluorinated silica glass, silicon, silicon nitride, silicon oxide, and/or the like, that electrically insulates the second metal contacts 220 from other components of the second semiconductor device 210. In some implementations, the deposition tool 102 of the environment 100, described above in connection with FIG. 1, may be utilized to form the IMD layer 218 on a top surface of epitaxial layer 216. For example, deposition tool 102 may perform a PECVD operation, an HDP-CVD operation, an SACVD operation, an ALD operation, a PVD operation, or another deposition operation to deposit the IMD layer 218 on the top surface of the epitaxial layer 216.

The second metal contacts 220 may include a conductive metal, such as titanium, cobalt, tungsten, aluminum, copper, ruthenium, iridium, and/or the like. In some implementations, the second metal contacts 220 may be formed within openings formed in the IMD layer 218. In some implementations, the deposition tool 102 of the environment 100, described above in connection with FIG. 1, may be utilized to perform a deposition operation that forms second metal contacts 220 in the openings of IMD layer 218. In some implementations, a plating tool is used to form the second metal contacts 220 in the IMD layer 218. In these examples, the plating tool may perform a plating operation to form the second metal contacts 220. The plating operation may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate (e.g., the IMD layer 218). The plating solution reaches the IMD layer 218 and deposits plating material ions into the openings in the IMD layer 218 to form the second metal contacts 220.

In some implementations, one or more semiconductor processing tools of the environment 100, described above in connection with FIG. 1, may be utilized to form the openings in the IMD layer 218, prior to formation of the second metal contacts 220 in the openings. For example, the deposition tool 102 may form a photoresist layer on the the IMD layer 218, the exposure tool 104 may expose the photoresist layer to a radiation source to pattern the photoresist layer, the developer tool 106 may develop and remove portions of the photoresist layer to expose the pattern, and the etching tool 108 may etch the one or more portions of the IMD layer 218 to form the openings in the USG layer 206. In some implementations, a photoresist removal tool removes the remaining portions of the photoresist layer (e.g., using a chemical stripper and/or another technique) after the etching tool 108 etches the IMD layer 218.

The passivation layer 221 may include an oxide material (e.g., a metal oxide) that is inert and does not change semiconductor properties as a result of interaction with air or other materials in contact with the passivation layer 221. The passivation layer 221 may allow electricity to reliably penetrate to conducting layers provided below the passivation layer 221, and to overcome surface states that prevent electricity from reaching the conducting layers. In some implementations, the deposition tool 102 of the environment 100, described above in connection with FIG. 1, may be utilized to form the passivation layer 221 on the top surface of the IMD layer 218 and the second metal contacts 220.

Figure 2B:
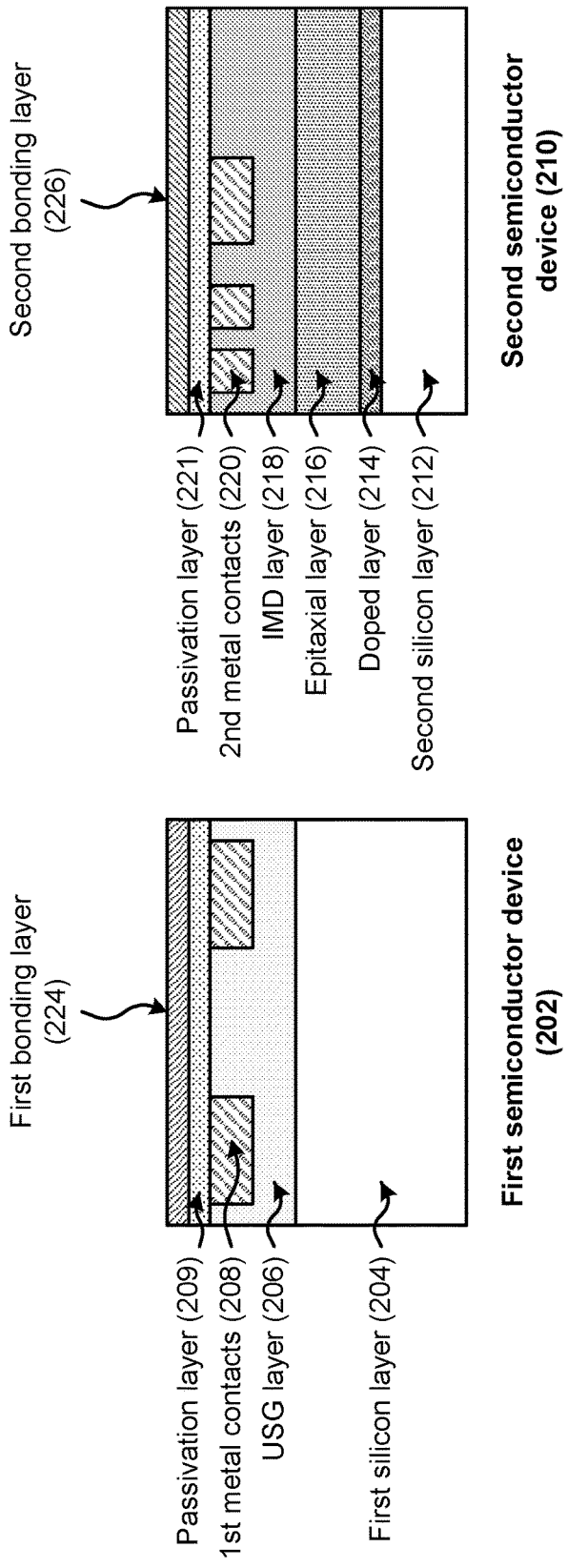

As shown in FIG. 2B, and by reference number 222, a deposition operation may be performed to form a first bonding layer 224 on a top surface of the first semiconductor device 202 and a second bonding layer 226 on a top surface of the second semiconductor device 210. For example, the first bonding layer 224 may be formed on top surfaces of the USG layer 206 and the first metal contacts 208, and the second bonding layer 226 may be formed on top surfaces of the IMD layer 218 and the second metal contacts 220. In some implementations, the deposition tool 102 of the environment 100, described above in connection with FIG. 1, may be utilized to form the first bonding layer 224 on the top surface of the first semiconductor device 202 and the second bonding layer 226 on the top surface of the second semiconductor device 210. For example, the deposition tool 102 may perform a CVD operation, a PECVD operation, an HDP-CVD operation, an SACVD operation, an ALD operation, a PVD operation, or another deposition operation to form the first bonding layer 224 on the top surface of the first semiconductor device 202 and the second bonding layer 226 on the top surface of second semiconductor device 210.

In some implementations, a planarization operation may be performed on the first bonding layer 224 and/or the second bonding layer 226 to flatten the first bonding layer 224 and/or the second bonding layer 226. In some implementations, the planarization tool 110 of the environment 100, described above in connection with FIG. 1, may perform the planarization operation. The planarization operation may include a chemical mechanical polishing/planarization (CMP) operation or another type of planarization operation. A CMP operation may include depositing a slurry (or polishing compound) onto a polishing pad. The first semiconductor device 202 may be mounted to a carrier, which may rotate the first semiconductor device 202 as the first semiconductor device 202 is pressed against the polishing pad. The slurry and polishing pad act as an abrasive that polishes or planarizes the first bonding layer 224 as the first semiconductor device 202 is rotated. The polishing pad may also be rotated to ensure a continuous supply of slurry is applied to the polishing pad. Similar techniques may be performed to planarize the second bonding layer 226 of the second semiconductor device 210.

In some implementations, the first bonding layer 224 and/or the second bonding layer 226 may be planarized to a particular thickness. For example, the first bonding layer 224 and/or the second bonding layer 226 may be planarized to a thickness in a range of approximately 10 angstroms to approximately 100,000 angstroms such that control over the surface uniformity and roughness may be maintained for the first bonding layer 224 and/or the second bonding layer 226. In some implementations, the first bonding layer 224 and/or the second bonding layer 226 may be planarized to achieve a particular surface roughness. For example, the first bonding layer 224 and/or the second bonding layer 226 may be planarized to achieve a surface roughness of less than 1 angstrom.

The first bonding layer 224 and the second bonding layer 226 may be heterogeneous bonding layers. In particular, the first bonding layer 224 and the second bonding layer 226 may be formed of one or more materials such that a chemical composition of the first bonding layer 224 and a chemical composition of the second bonding layer 226 are different chemical compositions. The first bonding layer 224 may be formed of one or more materials such that the chemical composition of the first bonding layer 224 is high in silicon content and hydroxy-containing silicon content (e.g., hydroxy group content), and low in nitrogen content. The second bonding layer 226 may be formed of one or more materials such that the chemical composition of the second bonding layer 226 includes silicon and is high in nitrogen content.

The silicon concentration (e.g., the hydroxy-containing silicon concentration) of the first bonding layer 224 may be greater than the silicon concentration of the second bonding layer 226. The high silicon concentration (e.g., the hydroxy-containing silicon concentration) of the first bonding layer 224 may cause or facilitate the formation of silicon-oxygen-silicon bonds during an annealing operation to bond the first semiconductor device 202 and the second semiconductor device 210. The nitrogen concentration of the second bonding layer 226 may be greater than the nitrogen concentration of the first bonding layer 224. The high nitrogen concentration of the second bonding layer 226 may enhance and/or increase the ease of the formation of the silicon-oxygen-silicon bonds during the annealing operation.

Accordingly, the silicon-to-nitrogen ratio of the first bonding layer 224 may be greater relative to the silicon-to-nitrogen ratio of the second bonding layer 226. As an example, the silicon-to-nitrogen ratio of the first bonding layer 224 may be approximately 20 or greater, and the silicon-to-nitrogen ratio of the second bonding layer 226 may be approximately 2 or less to facilitate the formation of silicon-oxygen-silicon bonds during an annealing operation to bond the first semiconductor device 202 and the second semiconductor device 210. As another example, the silicon-to-nitrogen ratio of the first bonding layer 224 may be in a range of approximately 20 to approximately 1000, and the silicon-to-nitrogen ratio of the second bonding layer 226 may be in a range of approximately 0.5 to approximately 2 to enhance and/or increase the formation of the silicon-oxygen-silicon bonds during the annealing operation.

In some implementations, the first bonding layer 224 is formed of a silicon oxide (SiO) (e.g., a hydroxy-containing silicon oxide), a silicon dioxide ($SiO_2$) (e.g., a hydroxy-containing silicon dioxide), a silicon oxycarbide (SiOC) (e.g., a hydroxy-containing silicon oxycarbide), or another silicon-containing material. The silicon-containing material may be bonded to hydroxy (or hydroxy group) components such as OH to form Si—OH bonds in the first bonding layer 224. In some implementations, the second bonding layer 226 is formed of a silicon nitride (SiN), a silicon oxynitride (SiON), a silicon carbon nitride (SiCN), or another silicon and nitrogen containing material.

Figure 2C:
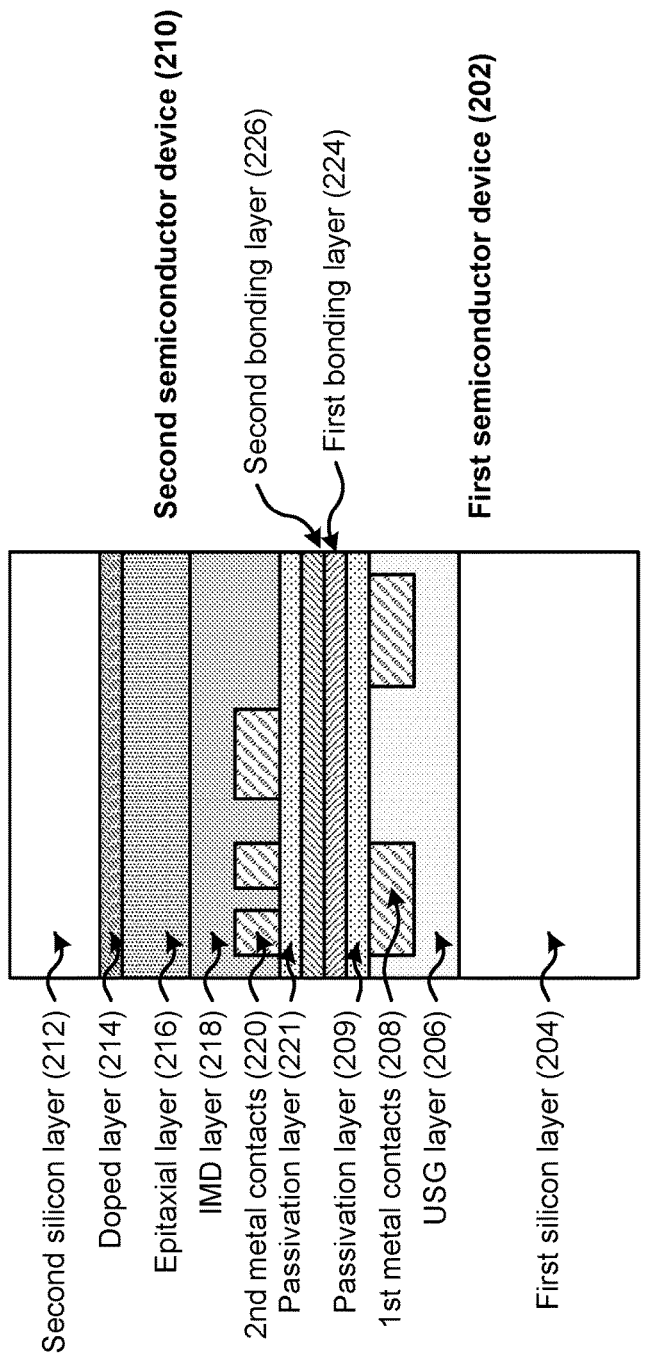

As shown in FIG. 2C, and by reference number 228, an annealing operation may be performed to fuse the first bonding layer 224 and the second bonding layer 226, which bonds the first semiconductor device 202 and the second semiconductor device 210. For example, one of the first semiconductor device 202 or the second semiconductor device 210 may be rotated one-hundred and eighty degrees so that the first bonding layer 224 faces the second bonding layer 226. FIG. 2C shows the second semiconductor device 210 being rotated one-hundred and eighty degrees, but the first semiconductor device 202 may be rotated one-hundred and eighty degrees instead of the second semiconductor device 210. Once the first bonding layer 224 faces the second bonding layer 226, the first bonding layer 224 may be bonded together with the second bonding layer 226, which may join the first semiconductor device 202 and the second semiconductor device 210. Thus, as shown in the example orientation of FIG. 2C, the second bonding layer 226 may be provided on a top surface of the first bonding layer 224. The second metal contacts 220 and the IMD layer 218 may be provided on the second bonding layer 226, and the epitaxial layer 216 may be provided on the IMD layer 218. The doped layer 214 may be provided on the epitaxial layer 216, and the second silicon layer 212 may be provided on the doped layer 214.

A bonding strength of each of the first bonding layer 224 and the second bonding layer 226 may be greater than two Joules per square meter to enable direct bonding of the first semiconductor device 202 and the second semiconductor device 210. For example, the bonding strength of each of the first bonding layer 224 and the second bonding layer 226 may be approximately greater than 2.5 Joules per square meter. The first semiconductor device 202 and the second semiconductor device 210 may be joined via the first bonding layer 224 and the second bonding layer 226 without pretreating the first bonding layer 224 and the second bonding layer 226 using a plasma treatment process. The bonding strength of the first bonding layer 224 and the second bonding layer 226 eliminates a need for expensive and time-consuming plasma pretreatment utilized in current bonding processes.

In some implementations, the annealing tool 112 of the environment 100, described above in connection with FIG. 1, may be utilized to perform the annealing operation to fuse or bond the first bonding layer 224 and the second bonding layer 226 (e.g., through covalent bonding of the first bonding layer 224 and the second bonding layer 226). In some implementations, the annealing operation may be performed under particular process conditions to fuse or bond the first bonding layer 224 and the second bonding layer 226. For example, the annealing operation may be performed at a temperature in a range from approximately 150 degrees Celsius to approximately 400 degrees Celsius and for a time period in a range from approximately 30 minutes to approximately 3 hours, to permit the covalent bonds to form between the first bonding layer 224 and the second bonding layer 226.

In some implementations, the annealing operation is a dry anneal, an RTA, or another type of annealing operation. The annealing operation may result in a dehydration reaction that occurs between the first bonding layer 224 and the second bonding layer 226. The dehydration reaction is a reaction that results in water (e.g., $H_2O$) being removed from the first bonding layer 224 and/or the second bonding layer 226. The dehydration reaction causes the hydroxy components (e.g., the OH components) of the first bonding layer 224 to decompose, which forms silicon-oxygen-silicon bonds (e.g., Si—O—Si bonds) between the first bonding layer 224 and the second bonding layer 226. Here, the silicon and the oxygen in silicon-hydroxy bonds (e.g., the Si—OH bonds) of the first bonding layer 224 are bonded with the silicon in the second bonding layer 226 to form the Si—O—Si bonds, with water forming as byproduct of the dehydration reaction. Moreover, the nitrogen in the second bonding layer 226 increases the effectiveness of the dehydration reaction and, therefore, the effectiveness and strength of the bond between the first bonding layer 224 and the second bonding layer 226. In particular, the nitrogen content in the second bonding layer 226 permits the Si—O—Si bonds between the first bonding layer 224 and the second bonding layer 224 to be more easily formed (e.g., than in the absence of nitrogen) during the annealing operation.

Figure 2D:
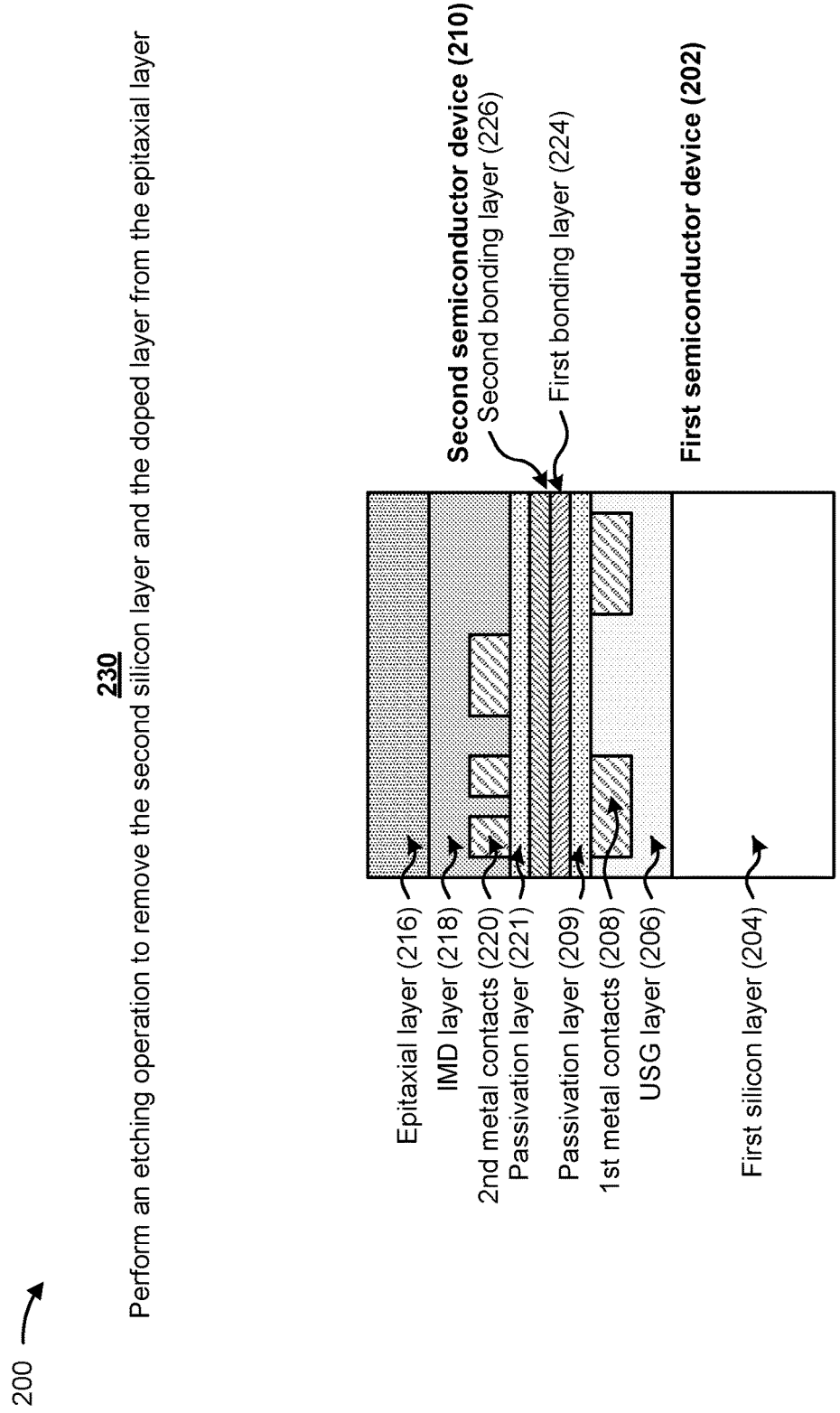

As shown in FIG. 2D, and by reference number 230, an etching operation may be performed to remove the second silicon layer 212 and the doped layer 214 from the epitaxial layer 216. In some implementations, a first etching operation is performed to remove the second silicon layer 212 from the doped layer 214, and a second etching operation is performed to remove the doped layer 214 from the epitaxial layer 216. In some implementations, the etching tool 108 of the environment 100, described above in connection with FIG. 1, may be utilized to perform the first etching operation to remove the second silicon layer 212 from the doped layer 214, and to perform the second etching operation to remove the doped layer 214 from the epitaxial layer 216. In some implementations, a single etching operation is performed to remove the second silicon layer 212 and the doped layer 214 from the epitaxial layer 216. In some implementations, the etching operation(s) may include wet etching operation(s), dry etching operation(s), plasma etching operation(s), and/or other types of etching operation(s).

Figure 2E:
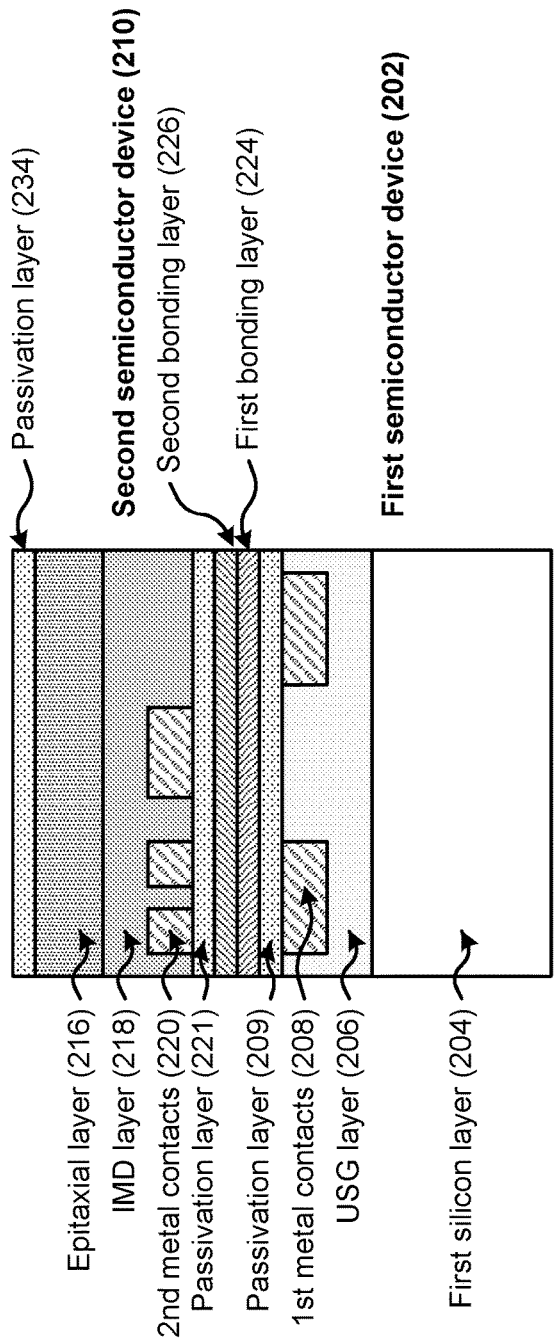

As shown in FIG. 2E, and by reference number 232, a passivation layer 234 may be formed on the epitaxial layer 216. For example, the passivation layer 234 may be deposited on a top surface of the epitaxial layer 216. The passivation layer 234 may include an oxide material (e.g., a metal oxide) that is inert and does not change semiconductor properties as a result of interaction with air or other materials in contact with the passivation layer 234. The passivation layer 234 may allow electricity to reliably penetrate to conducting layers provided below the passivation layer 234, and to overcome surface states that prevent electricity from reaching the conducting layers. In some implementations, the deposition tool 102 of the environment 100, described above in connection with FIG. 1, may be utilized to form the passivation layer 234 on the top surface of the epitaxial layer 216.

Figure 2F:
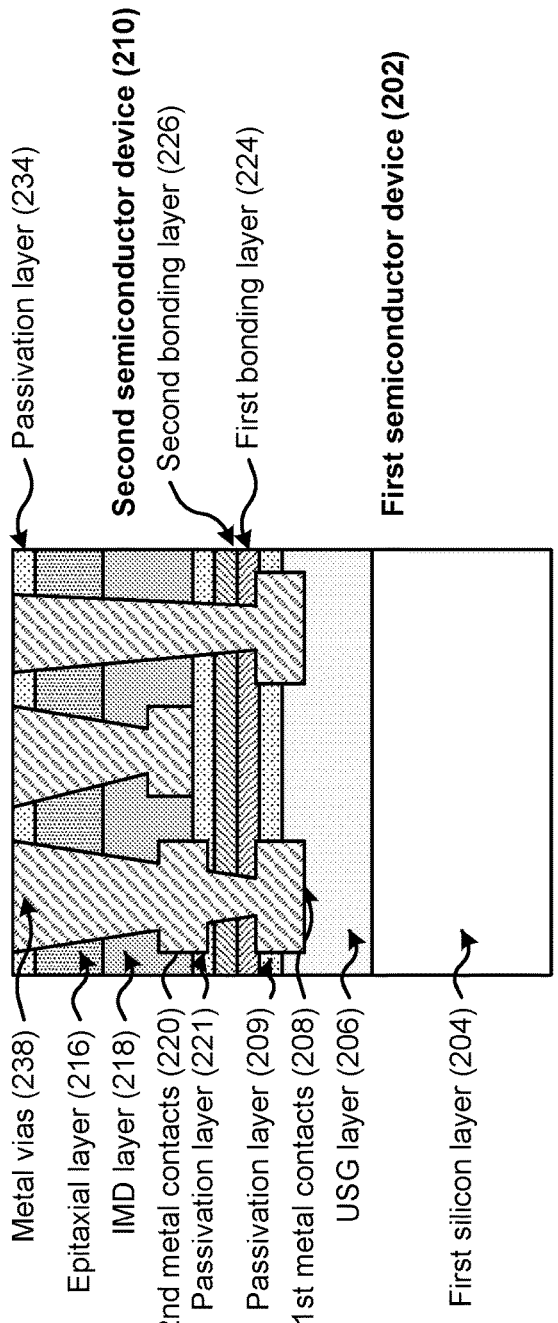

As shown in FIG. 2F, and by reference number 236, metal vias 238 may be formed, through the passivation layer 234, the epitaxial layer 216, the IMD layer 218, the first bonding layer 224, and the second bonding layer 226, to connect with the first metal contacts 208 and the second metal contacts 220. For example, the deposition tool 102, the exposure tool 104, the developer tool 106, and the etching tool 108 may be performed to form openings through the passivation layer 234, the epitaxial layer 216, the IMD layer 218, the second metal contacts 220, the first bonding layer 224, and/or the second bonding layer 226. The deposition tool 102 may perform one or more deposition operations, or a plating tool may perform one or more electroplating operations, to provide the metal vias 238 in the openings formed through the passivation layer 234, the epitaxial layer 216, the IMD layer 218, the second metal contacts 220, the first bonding layer 224, and/or the second bonding layer 226.

The metal vias 238 may include a conductive metal, such as titanium, cobalt, tungsten, aluminum, copper, ruthenium, iridium, and/or the like. In some implementations, a metal via 238 may be formed for each of the first metal contacts 208 and each of the second metal contacts 220. In some implementations, a single metal via 238 may be formed such that the single metal via 238 connects with two or more of the first metal contacts 208 and/or two or more of the second metal contacts 220.

As shown in FIG. 2G, and by reference number 240, third metal contacts 242 may be formed on the metal vias 238. The third metal contacts 242 may include a conductive metal, such as titanium, cobalt, tungsten, aluminum, copper, ruthenium, iridium, and/or the like. In some implementations, the deposition tool 102 of the environment 100, described above in connection with FIG. 1, may be utilized to form third metal contacts 246 on metal vias 238. In some implementations, a plating tool may be used to perform an electroplating process to form the third metal contacts 246 on the metal vias 238. The final arrangement of the device (or the portion thereof) may include stacked semiconductor devices (e.g., the first semiconductor device 202 and the second semiconductor device 210), a three-dimensional integrated circuit, and/or the like. In some implementations, a third metal contact 242 may be formed on each of the metal vias 238. In some implementations, a single third metal contact 242 may be formed on two or more of the metal vias 238.

The number and arrangement of structures, layers, and/or the like shown in FIGS. 2A-2G are provided as an example. In practice, the device may include additional structures and/or layers, fewer structures and/or layers, different structures and/or layers, or differently arranged structures and/or layers than those shown in FIG. 2A-2G.

FIG. 3 is a diagram of example components of a device 300. In some implementations, the deposition tool 102, the exposure tool 104, the developer tool 106, the etching tool 108, the planarization tool 110, the annealing tool 112, and/or wafer/die transport tool 114 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication component 370 includes a transceiver-like component (e.g., a transceiver and/or a separate receiver and transmitter) that enables device 300 to communicate with other devices, such as via a wired connection, a wireless connection, or a combination of wired and wireless connections. Communication component 370 may permit device 300 to receive information from another device and/or provide information to another device. For example, communication component 370 may include an Ethernet interface, an optical interface, a coaxial interface, an infrared interface, a radio frequency (RF) interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication component 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
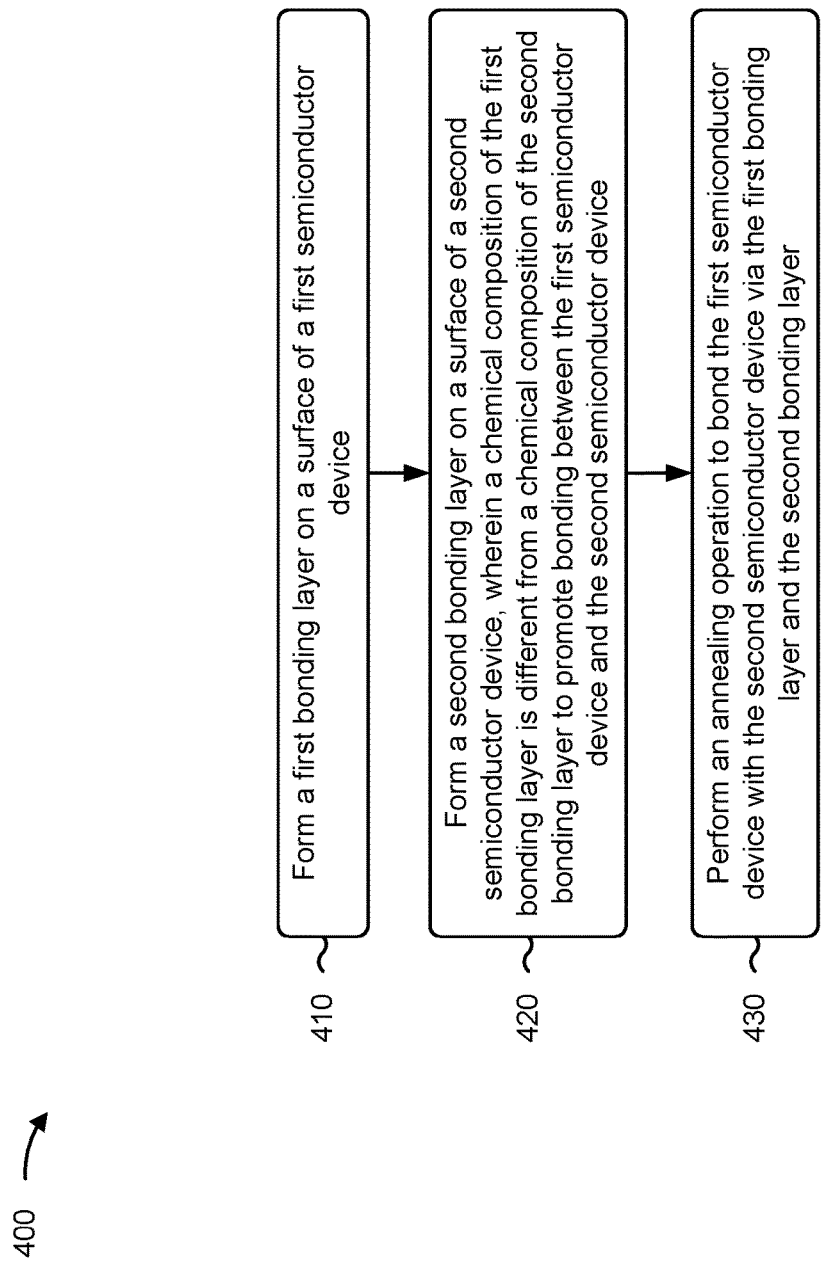

FIG. 4 is a flowchart of an example process 400 associated with joining semiconductor devices. In some implementations, one or more process blocks of FIG. 4 may be performed by one or more semiconductor processing tool (e.g., one or more of the semiconductor processing tools 102-110). Additionally, or alternatively, one or more process blocks of FIG. 4 may be performed by one or more components of device 300, such as processor 320, memory 330, storage component 340, input component 350, output component 360, and/or communication component 370.

As shown in FIG. 4, process 400 may include forming a first bonding layer on a surface of a first semiconductor device (block 410). For example, a semiconductor processing tool (e.g., the deposition tool 102) may form a first bonding layer 224 on a surface of a first semiconductor device 202, as described above.

As further shown in FIG. 4, process 400 may include forming a second bonding layer on a surface of a second semiconductor device, wherein a chemical composition of the first bonding layer is different from a chemical composition of the second bonding layer to promote bonding between the first semiconductor device and the second semiconductor device (block 420). For example, a semiconductor processing tool (e.g., the deposition tool 102) may form a second bonding layer 226 on a surface of a second semiconductor device 210, as described above. In some implementations, a chemical composition of the first bonding layer 224 is different from a chemical composition of the second bonding layer 226 to promote bonding between the first semiconductor device 202 and the second semiconductor device 210.

As further shown in FIG. 4, process 400 may include performing an annealing operation to bond the first semiconductor device with the second semiconductor device via the first bonding layer and the second bonding layer (block 430). For example, the semiconductor processing tool (e.g., the annealing tool 112) may perform an annealing operation to bond the first semiconductor device 202 with the second semiconductor device 210 via the first bonding layer 224 and the second bonding layer 226, as described above.

Process 400 may include additional implementations, such as any single implementation or any combination of implementations described below and/or in connection with one or more other processes described elsewhere herein.

In a first implementation, the first bonding layer 224 and the second bonding layer 226 each includes a thickness in a range from approximately 10 angstroms to approximately 100,000 angstroms. In a second implementation, alone or in combination with the first implementation, a silicon-to-nitrogen ratio of the chemical composition of the first bonding layer 224 is greater relative to a silicon-to-nitrogen ratio of the chemical composition of the second bonding layer 226. In a third implementation, alone or in combination with one or more of the first and second implementations, the chemical composition of the first bonding layer comprises a hydroxy-containing silicon dioxide, and wherein the chemical composition of the second bonding layer comprises a silicon nitride. In a fourth implementation, alone or in combination with one or more of the first through third implementations, performing the annealing operation to bond the first semiconductor device 202 with the second semiconductor device 210 via the first bonding layer 224 and the second bonding layer 226 includes performing the annealing operation to bond the first semiconductor device 202 with the second semiconductor device 210 via the first bonding layer 224 and the second bonding layer 226 without pretreating the first bonding layer or the second bonding layer.

In a fifth implementation, alone or in combination with one or more of the first through fourth implementations, performing the annealing operation fuse the first bonding layer 224 and the second bonding layer 226, where the chemical composition of the first bonding layer 224 and the chemical composition of the second bonding layer 226 cause formation of silicon-oxygen-silicon bonds between the first bonding layer 224 and the second bonding layer 226 to directly bond the first semiconductor device 202 and the second semiconductor device 210. In a sixth implementation, alone or in combination with one or more of the first through fifth implementations, a roughness of the first bonding layer 224 or the second bonding layer 226 is less than approximately 1 angstrom.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIG. 5 is a flowchart of an example process 500 associated with bonding semiconductor devices. In some implementations, one or more process blocks of FIG. 5 may be performed by one or more semiconductor processing tool (e.g., one or more of the semiconductor processing tools 102-110). Additionally, or alternatively, one or more process blocks of FIG. 5 may be performed by one or more components of device 300, such as processor 320, memory 330, storage component 340, input component 350, output component 360, and/or communication component 370.

As shown in FIG. 5, process 500 may include forming a first bonding layer on a surface of a first semiconductor device (block 510). For example, a semiconductor processing tool (e.g., the deposition tool 102) may form a first bonding layer 224 on a surface of a first semiconductor device 202, as described above.

As further shown in FIG. 5, process 500 may include forming a second bonding layer on a surface of a second semiconductor device (block 520). For example, a semiconductor processing tool (e.g., the deposition tool 102) may form a second bonding layer 226 on a surface of a second semiconductor device 210, as described above.

As further shown in FIG. 5, process 500 may include performing an annealing operation to bond the first semiconductor device and the second semiconductor device via the first bonding layer and the second bonding layer, wherein a hydroxy-containing silicon concentration of the first bonding layer results in formation of silicon-oxygen-silicon bonds during the annealing operation, and wherein a nitrogen concentration of the second bonding layer increases the formation of the silicon-oxygen-silicon bonds during the annealing operation (block 530). For example, a semiconductor processing tool (e.g., the annealing tool 112) may perform an annealing operation to bond the first semiconductor device 202 and the second semiconductor device 210 via the first bonding layer 224 and the second bonding layer 226, as described above. In some implementations, a hydroxy-containing silicon concentration of the first bonding layer 224 results in formation of silicon-oxygen-silicon bonds during the annealing operation. In some implementations, a nitrogen concentration of the second bonding layer 226 increases the formation of the silicon-oxygen-silicon bonds during the annealing operation.

Process 500 may include additional implementations, such as any single implementation or any combination of implementations described below and/or in connection with one or more other processes described elsewhere herein.

In a first implementation, a silicon-to-nitrogen ratio of the first bonding layer 224 is approximately 20 or greater. In a second implementation, alone or in combination with the first implementation, a silicon-to-nitrogen ratio of the second bonding layer 226 is approximately 2 or less. In a third implementation, alone or in combination with one or more of the first and second implementations, the nitrogen concentration of the second bonding layer increases effectiveness of a dehydration reaction that occurs between the first bonding layer and the second bonding layer during the annealing operation.

In a fourth implementation, alone or in combination with one or more of the first through third implementations, performing the annealing operation to bond the first semiconductor device 202 and the second semiconductor device 210 via the first bonding layer 224 and the second bonding layer 226 includes performing the annealing operation to bond the first semiconductor device 202 and the second semiconductor device 210 via the first bonding layer 224 and the second bonding layer 226 without performing a pretreatment process for the first bonding layer 224 or the second bonding layer 226 prior to the annealing operation. In a fifth implementation, alone or in combination with one or more of the first through fourth implementations, performing the annealing operation to bond the first semiconductor device 202 and the second semiconductor device 210 via the first bonding layer 224 and the second bonding layer 226 includes performing the annealing operation, at a temperature in a range from approximately 150 degrees Celsius to approximately 400 degrees Celsius and for a time period in a range from approximately 30 minutes to approximately 3 hours, to fuse the first bonding layer 224 and the second bonding layer 226.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIGS. 6A-6D are diagrams of one or more example operations 600 involved in manufacturing an example semiconductor device described herein. In particular, the one or more example operations 600 may be performed to bond the second semiconductor device 210 to a carrier substrate such as a silicon carrier wafer such that one or more additional operations (e.g., one or more backside operations) may be performed on the second semiconductor device 210 while the second semiconductor device 210 is supported by the carrier substrate.

Figure 6A:
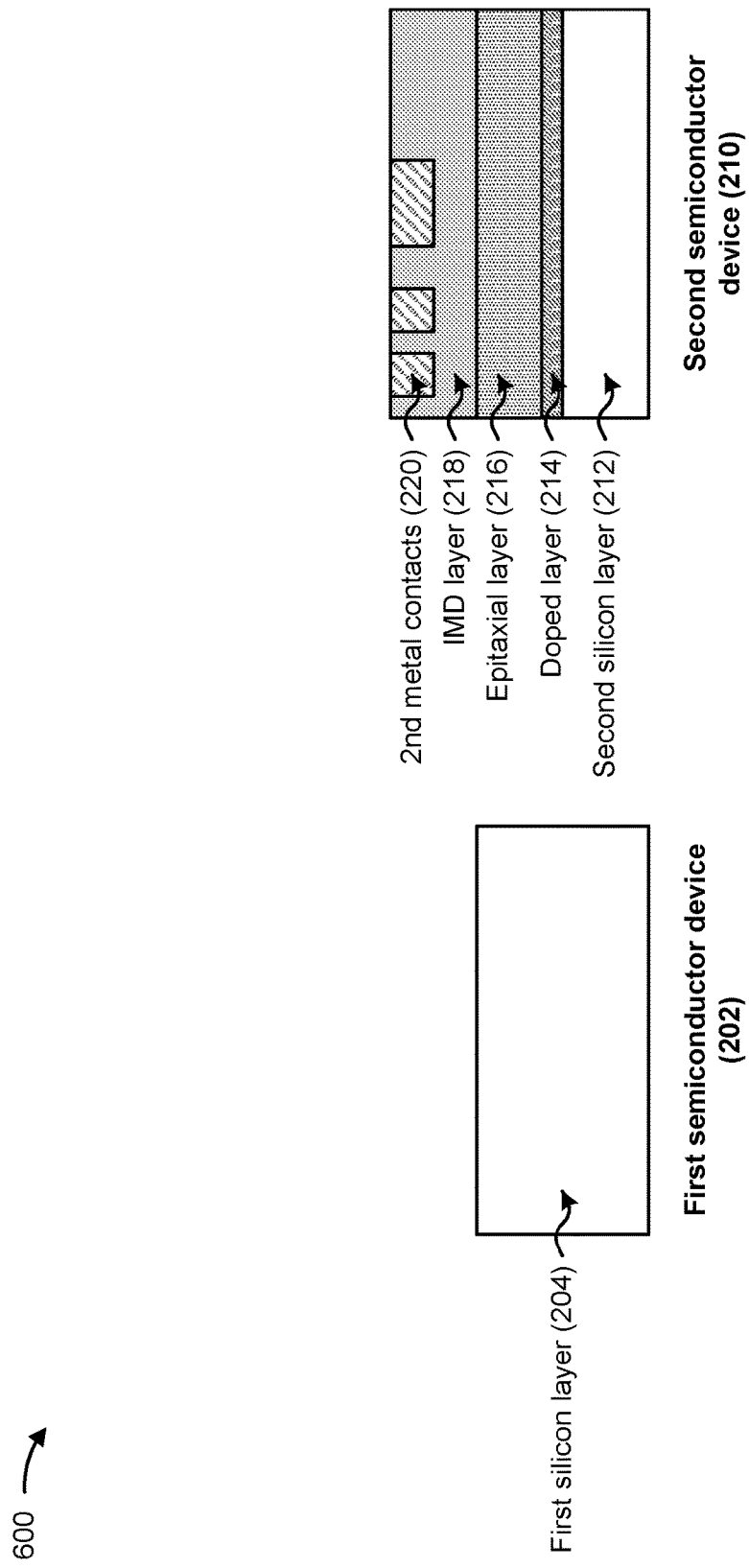
FIGS. 6A-6D are diagrams of one or more example operations involved in manufacturing an example semiconductor device described herein.

As shown in FIG. 6A, a first semiconductor device 202 may include a first silicon layer 204. The first silicon layer 204 may be a carrier substrate such as a silicon carrier wafer. As further shown in FIG. 6A, second semiconductor device 210 may include the second silicon layer 212, the doped layer 214 provided on the second silicon layer 212, the epitaxial layer 216 formed on the doped layer 214, the IMD layer 218 formed on the epitaxial layer 216, and the second metal contacts 220 formed in the IMD layer 218. In some implementations, the passivation layer 221 may also be formed on the IMD layer 218 and the second metal contacts 220.

Figure 6B:
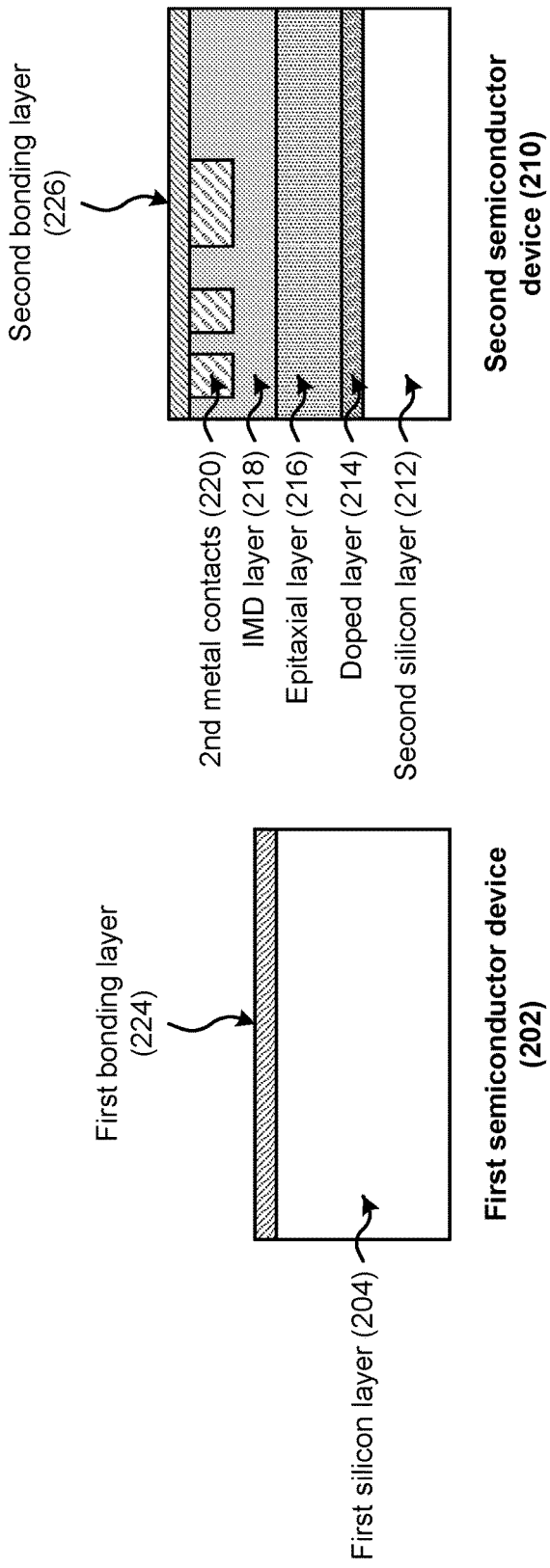

As shown in FIG. 6B, and by reference number 602, a deposition operation may be performed to form a first bonding layer 224 on a top surface of the first semiconductor device 202 and a second bonding layer 226 on a top surface of the second semiconductor device 210. For example, the first bonding layer 224 may be formed on the top surface of the first silicon layer 204, and the second bonding layer 226 may be formed on top surfaces of the IMD layer 218 and the second metal contacts 220. In some implementations, the deposition tool 102 of the environment 100, described above in connection with FIG. 1, may be utilized to form the first bonding layer 224 on the top surface of the first semiconductor device 202 and the second bonding layer 226 on the top surface of the second semiconductor device 210. For example, the deposition tool 102 may perform a CVD operation, a PECVD operation, an HDP-CVD operation, an SACVD operation, an ALD operation, a PVD operation, or another deposition operation to form the first bonding layer 224 on the top surface of the first semiconductor device 202 and the second bonding layer 226 on the top surface of second semiconductor device 210.

In some implementations, a planarization operation may be performed on the first bonding layer 224 and/or the second bonding layer 226 to flatten the first bonding layer 224 and/or the second bonding layer 226. In some implementations, the planarization tool 110 of the environment 100, described above in connection with FIG. 1, may perform the planarization operation. The planarization operation may include a CMP operation or another type of planarization operation. In some implementations, the first bonding layer 224 and/or the second bonding layer 226 may be planarized to a particular thickness. For example, the first bonding layer 224 and/or the second bonding layer 226 may be planarized to a thickness in a range of approximately 10 angstroms to approximately 100,000 angstroms such that control over the surface uniformity and roughness may be maintained for the first bonding layer 224 and/or the second bonding layer 226. In some implementations, the first bonding layer 224 and/or the second bonding layer 226 may be planarized to achieve a particular surface roughness. For example, the first bonding layer 224 and/or the second bonding layer 226 may be planarized to achieve a surface roughness of less than 1 angstrom.

The first bonding layer 224 and the second bonding layer 226 may be heterogeneous bonding layers. In particular, the first bonding layer 224 and the second bonding layer 226 may be formed of one or more materials such that a chemical composition of the first bonding layer 224 and a chemical composition of the second bonding layer 226 are different chemical compositions. The first bonding layer 224 may be formed of one or more materials such that the chemical composition of the first bonding layer 224 is high in silicon content and hydroxy-containing silicon content (e.g., hydroxy group content), and low in nitrogen content. The second bonding layer 226 may be formed of one or more materials such that the chemical composition of the second bonding layer 226 includes silicon and is high in nitrogen content.

The silicon concentration (e.g., the hydroxy-containing silicon concentration) of the first bonding layer 224 may be greater than the silicon concentration of the second bonding layer 226. The high silicon concentration (e.g., the hydroxy-containing silicon concentration) of the first bonding layer 224 may cause or facilitate the formation of silicon-oxygen-silicon bonds during an annealing operation to bond the first semiconductor device 202 and the second semiconductor device 210. The nitrogen concentration of the second bonding layer 226 may be greater than the nitrogen concentration of the first bonding layer 224. The high nitrogen concentration of the second bonding layer 226 may enhance and/or increase the ease of the formation of the silicon-oxygen-silicon bonds during the annealing operation.

Accordingly, the silicon-to-nitrogen ratio of the first bonding layer 224 may be greater relative to the silicon-to-nitrogen ratio of the second bonding layer 226. As an example, the silicon-to-nitrogen ratio of the first bonding layer 224 may be approximately 20 or greater, and the silicon-to-nitrogen ratio of the second bonding layer 226 may be approximately 2 or less to facilitate the formation of silicon-oxygen-silicon bonds during an annealing operation to bond the first semiconductor device 202 and the second semiconductor device 210. As another example, the silicon-to-nitrogen ratio of the first bonding layer 224 may be in a range of approximately 20 to approximately 1000, and the silicon-to-nitrogen ratio of the second bonding layer 226 may be in a range of approximately 0.5 to approximately 2 to enhance and/or increase the formation of the silicon-oxygen-silicon bonds during the annealing operation.

In some implementations, the first bonding layer 224 is formed of a silicon oxide (SiO) (e.g., a hydroxy-containing silicon oxide), a silicon dioxide ($SiO_2$) (e.g., a hydroxy-containing silicon dioxide), a silicon oxycarbide (SiOC) (e.g., a hydroxy-containing silicon oxycarbide), or another silicon-containing material. The silicon-containing material may be bonded to hydroxy (or hydroxy group) components such as OH to form Si—OH bonds in the first bonding layer 224. In some implementations, the second bonding layer 226 is formed of a silicon nitride (SiN), a silicon oxynitride (SiON), a silicon carbon nitride (SiCN), or another silicon and nitrogen containing material.

Figure 6C:
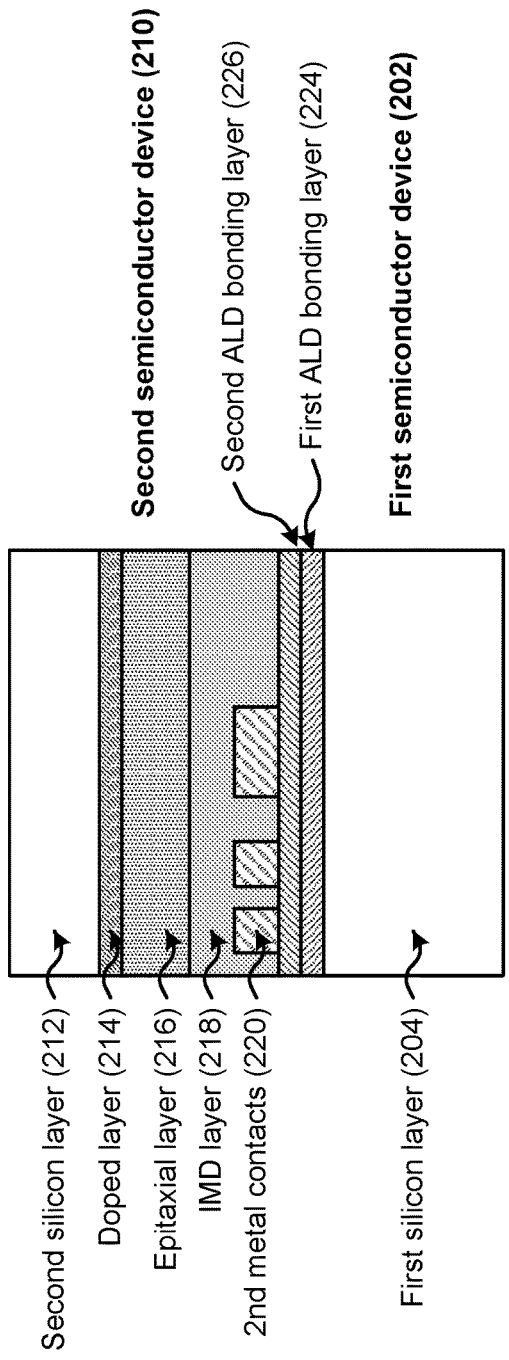

As shown in FIG. 6C, and by reference number 604, an annealing operation may be performed to fuse the first bonding layer 224 and the second bonding layer 226, which bonds the first semiconductor device 202 and the second semiconductor device 210. For example, one of the first semiconductor device 202 or the second semiconductor device 210 may be rotated one-hundred and eighty degrees so that the first bonding layer 224 faces the second bonding layer 226. FIG. 6C shows the second semiconductor device 210 being rotated one-hundred and eighty degrees, but the first semiconductor device 202 may be rotated one-hundred and eighty degrees instead of the second semiconductor device 210. Once the first bonding layer 224 faces the second bonding layer 226, the first bonding layer 224 may be bonded together with the second bonding layer 226, which may join the first semiconductor device 202 and the second semiconductor device 210. Thus, as shown in the example orientation of FIG. 6C, the second bonding layer 226 may be provided on a top surface of the first bonding layer 224. The second metal contacts 220 and the IMD layer 218 may be provided on the second bonding layer 226, and the epitaxial layer 216 may be provided on the IMD layer 218. The doped layer 214 may be provided on the epitaxial layer 216, and the second silicon layer 212 may be provided on the doped layer 214.

A bonding strength of each of the first bonding layer 224 and the second bonding layer 226 may be greater than two Joules per square meter to enable direct bonding of the first semiconductor device 202 and the second semiconductor device 210. For example, the bonding strength of each of the first bonding layer 224 and the second bonding layer 226 may be approximately greater than 2.5 Joules per square meter. The first semiconductor device 202 and the second semiconductor device 210 may be joined via the first bonding layer 224 and the second bonding layer 226 without pretreating the first bonding layer 224 and the second bonding layer 226 using a plasma treatment process. The bonding strength of the first bonding layer 224 and the second bonding layer 226 eliminates a need for expensive and time-consuming plasma pretreatment utilized in current bonding processes.

In some implementations, the annealing tool 112 of the environment 100, described above in connection with FIG. 1, may be utilized to perform the annealing operation to fuse or bond the first bonding layer 224 and the second bonding layer 226 (e.g., through covalent bonding of the first bonding layer 224 and the second bonding layer 226). In some implementations, the annealing operation may be performed under particular process conditions to fuse or bond the first bonding layer 224 and the second bonding layer 226. For example, the annealing operation may be performed at a temperature in a range from approximately 150 degrees Celsius to approximately 400 degrees Celsius and for a time period in a range from approximately 30 minutes to approximately 3 hours, to permit the covalent bonds to form between the first bonding layer 224 and the second bonding layer 226.

In some implementations, the annealing operation is a dry anneal, an RTA, or another type of annealing operation. The annealing operation may result in a dehydration reaction that occurs between the first bonding layer 224 and the second bonding layer 226. The dehydration reaction is a reaction that results in water (e.g., $H_2O$) being removed from the first bonding layer 224 and/or the second bonding layer 226. The dehydration reaction causes the hydroxy components (e.g., the OH components) of the first bonding layer 224 to decompose, which forms silicon-oxygen-silicon bonds (e.g., Si—O—Si bonds) between the first bonding layer 224 and the second bonding layer 226. Here, the silicon and the oxygen in silicon-hydroxy bonds (e.g., the Si—OH bonds) of the first bonding layer 224 are bonded with the silicon in the second bonding layer 226 to form the Si—O—Si bonds, with water forming as byproduct of the dehydration reaction. Moreover, the nitrogen in the second bonding layer 226 increases the effectiveness of the dehydration reaction and, therefore, the effectiveness and strength of the bond between the first bonding layer 224 and the second bonding layer 226. In particular, the nitrogen content in the second bonding layer 226 permits the Si—O—Si bonds between the first bonding layer 224 and the second bonding layer 224 to be more easily formed (e.g., than in the absence of nitrogen) during the annealing operation.

Figure 6D:
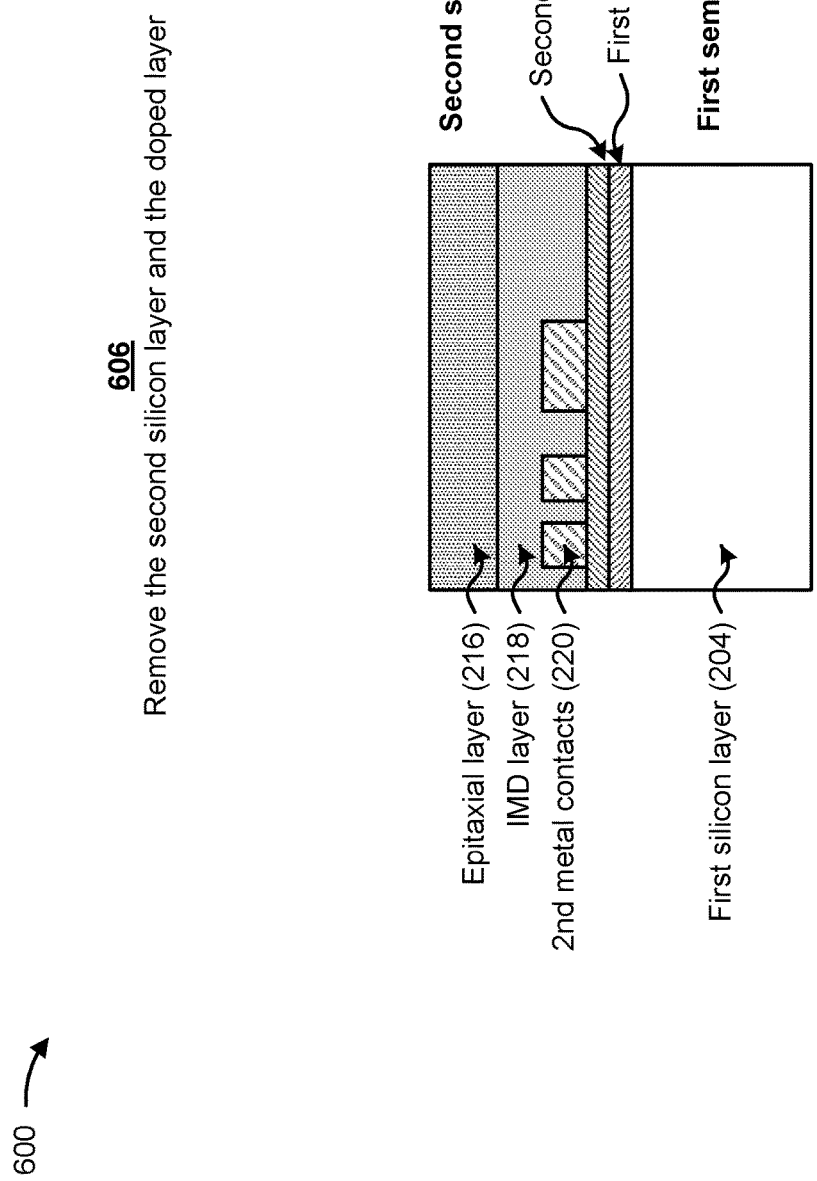

As shown in FIG. 6D, and by reference number 606, an etching operation may be performed to remove the second silicon layer 212 and the doped layer 214 from the epitaxial layer 216. In some implementations, a first etching operation is performed to remove the second silicon layer 212 from the doped layer 214, and a second etching operation is performed to remove the doped layer 214 from the epitaxial layer 216. In some implementations, the etching tool 108 of the environment 100, described above in connection with FIG. 1, may be utilized to perform the first etching operation to remove the second silicon layer 212 from the doped layer 214, and to perform the second etching operation to remove the doped layer 214 from the epitaxial layer 216. In some implementations, a single etching operation is performed to remove the second silicon layer 212 and the doped layer 214 from the epitaxial layer 216. In some implementations, the etching operation(s) may include wet etching operation(s), dry etching operation(s), plasma etching operation(s), and/or other types of etching operation(s).

In this way, the annealing operation described above in connection with reference number 606 may be performed to bond second semiconductor device 210 to a carrier substrate such as a silicon carrier wafer (e.g., first silicon layer 204) such that one or more additional operations (e.g., one or more backside operations) may be performed on second semiconductor device 210 while second semiconductor device 210 is supported by the carrier substrate.

As indicated above, FIGS. 6A-6D are provided merely as one or more examples. Other examples may differ from what is described with regard to FIGS. 6A-6D.

Figure 7:
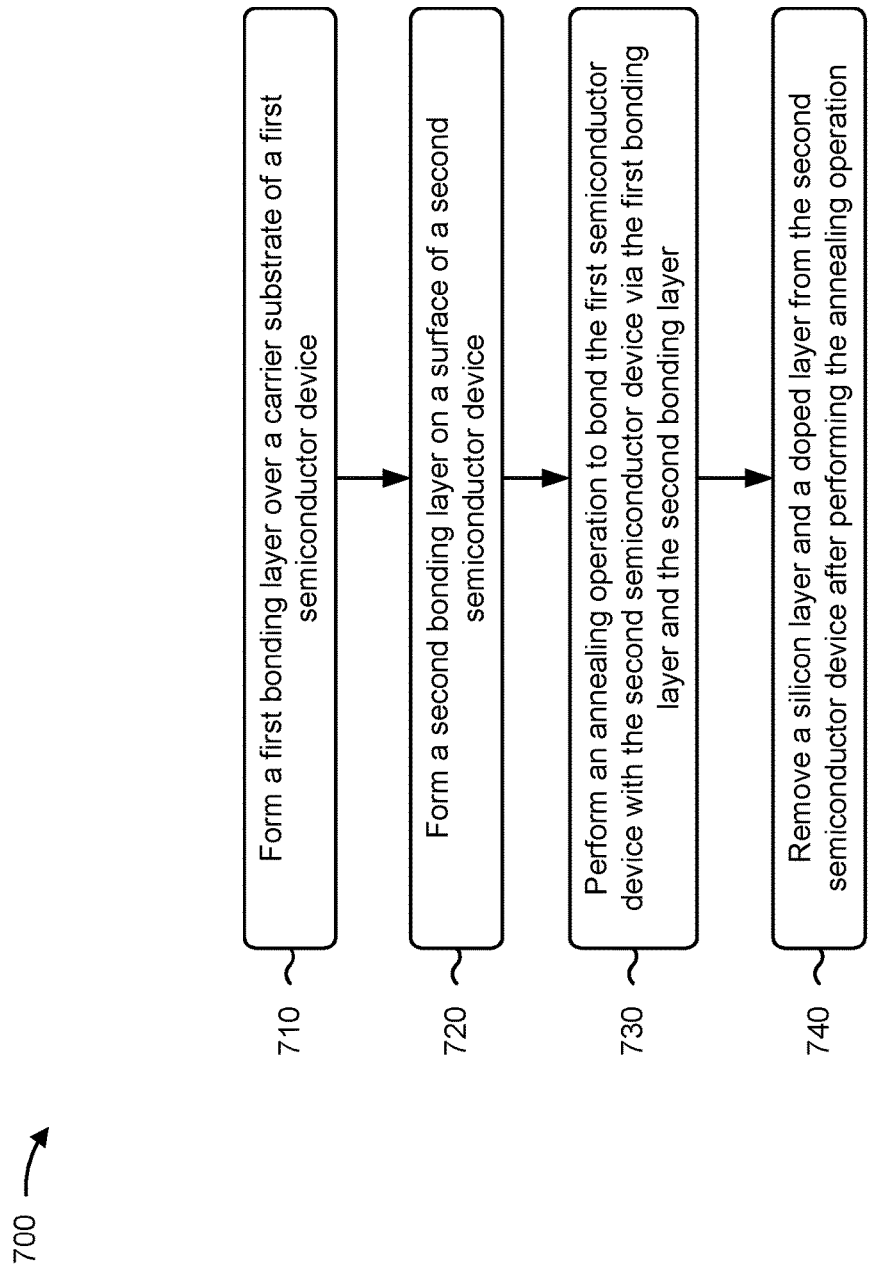
FIG. 7 is a flowchart of an example process for joining a semiconductor device described herein.

FIG. 7 is a flow chart of an example process 700 for joining semiconductor devices. In some implementations, one or more process blocks of FIG. 7 may be performed by a device (e.g., one or more of the tools depicted in FIG. 1). In some implementations, one or more process blocks of FIG. 7 may be performed by another device or a group of devices separate from or including the one or more tools depicted in FIG. 1. Additionally, or alternatively, one or more process blocks of FIG. 7 may be performed by one or more components of device 300, such as processor 320, memory 330, storage component 340, input component 350, output component 360, communication component 370, and/or the like.

As shown in FIG. 7, process 700 may include forming a first bonding layer over a carrier substrate of a first semiconductor device (block 710). For example, the device may form first bonding layer 224 over a carrier substrate of a first semiconductor device 202, as described above. The carrier substrate includes a first silicon layer 204 such as a silicon carrier wafer.

As further shown in FIG. 7, process 700 may include forming a second bonding layer on a surface of a second semiconductor device (block 720). For example, the device may form a second bonding layer 226 on a surface of a second semiconductor device 210, as described above.

As further shown in FIG. 7, process 700 may include performing an annealing operation to bond the first semiconductor device with the second semiconductor device via the first bonding layer and the second bonding layer (block 730). For example, the device may perform an annealing operation to bond the first semiconductor device 202 with the second semiconductor device 210 via the first bonding layer 224 and the second bonding layer 224, as described above. In some implementations, a hydroxy-containing silicon concentration of the first bonding layer 224 results in formation of silicon-oxygen-silicon bonds during the annealing operation. In some implementations, a nitrogen concentration of the second bonding layer 226 increases the formation of the silicon-oxygen-silicon bonds during the annealing operation As further shown in FIG. 7, process 700 may include removing a silicon layer and a doped layer from the second semiconductor device after performing the annealing operation (block 740). For example, the device may remove the second silicon layer 212 and a doped layer 214 from the second semiconductor device 210 after performing the annealing operation, as described above.

Process 700 may include additional implementations, such as any single implementation or any combination of implementations described below and/or in connection with one or more other processes described elsewhere herein. Although FIG. 7 shows example blocks of process 700, in some implementations, process 700 may include additional blocks, fewer blocks, different blocks, or differently arranged blocks than those depicted in FIG. 6. Additionally, or alternatively, two or more of the blocks of process 700 may be performed in parallel.

In this way, a first semiconductor device and a second semiconductor device may be directly bonded using heterogeneous bonding layers. A first bonding layer may be formed on the first semiconductor device and the second bonding layer may be formed on the second semiconductor device that is to be bonded or joined to the first semiconductor device. Each bonding layer may include a silicon-containing material. The first bonding layer may include a higher concentration of hydroxy-containing silicon and a lower concentration of nitrogen relative to the second bonding layer. The second bonding layer may include silicon with a higher concentration of nitrogen relative to the first bonding layer. A dry anneal may be performed to cause a dehydration reaction that results in decomposition of the hydroxy components of the first bonding layer, which forms silicon oxide bonds between the first bonding layer and the second bonding layer. The nitrogen in the second bonding layer increases the effectiveness of the dehydration reaction and, therefore, the effectiveness and strength of the bond between the first bonding layer and the second bonding layer. Accordingly, the first semiconductor device and the second semiconductor device may be directly bonded without the use of a plasma pretreatment process, which decreases a cost and a complexity of the bonding process.

As described in greater detail above, some implementations described herein provide a method. The method includes forming a first bonding layer on a surface of a first semiconductor device. The method includes forming a second bonding layer on a surface of a second semiconductor device. A chemical composition of the first bonding layer is different from a chemical composition of the second bonding layer to promote bonding between the first semiconductor device and the second semiconductor device. The method includes performing an annealing operation to bond the first semiconductor device with the second semiconductor device via the first bonding layer and the second bonding layer.

As described in greater detail above, some implementations described herein provide a device. The device includes a first semiconductor device, a second semiconductor device, and a first bonding layer and a second bonding layer. The first bonding layer and the second bonding layer both join the first semiconductor device and the second semiconductor device. A chemical composition of the first bonding layer includes a greater silicon concentration relative to a chemical composition of the second bonding layer to cause formation of silicon-oxygen-silicon bonds between the first bonding layer and the second bonding layer. The chemical composition of the second bonding layer includes a greater nitrogen concentration relative to the chemical composition of the first bonding layer to increase the formation of the silicon-oxygen-silicon bonds between the first bonding layer and the second bonding layer.

As described in greater detail above, some implementations described herein provide a method. The method includes forming a first bonding layer on a surface of a first semiconductor device. The method includes forming a second bonding layer on a surface of a second semiconductor device. The method includes performing an annealing operation to bond the first semiconductor device and the second semiconductor device via the first bonding layer and the second bonding layer. A hydroxy-containing silicon concentration of the first bonding layer results in formation of silicon-oxygen-silicon bonds during the annealing operation. A nitrogen concentration of the second bonding layer increases the formation of the silicon-oxygen-silicon bonds during the annealing operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first semiconductor device;
   a second semiconductor device; and
   a first bonding layer and a second bonding layer, both joining the first semiconductor device and the second semiconductor device,
   wherein a chemical composition of the first bonding layer includes a greater silicon concentration relative to a chemical composition of the second bonding layer to cause formation of silicon-oxygen-silicon bonds between the first bonding layer and the second bonding layer, and
   wherein the chemical composition of the second bonding layer includes a greater nitrogen concentration relative to the chemical composition of the first bonding layer to increase the formation of the silicon-oxygen-silicon bonds between the first bonding layer and the second bonding layer.

2. The device of claim 1, wherein a silicon-to-nitrogen ratio of the chemical composition of the first bonding layer is in a range of approximately 20 to approximately 1000.

3. The device of claim 1, wherein a silicon-to-nitrogen ratio of the chemical composition of the second bonding layer is in a range of approximately 0.5 to approximately 2.

4. The device of claim 1, wherein the first bonding layer includes at least one of:
   silicon oxide,
   silicon dioxide, or
   a silicon oxycarbide.

5. The device of claim 1, wherein the second bonding layer includes at least one of:
   a silicon nitride,
   a silicon carbon nitride, or
   a silicon oxynitride.

6. The device of claim 1, wherein a bond between the first bonding layer and the second bonding layer comprises a silicon-oxygen-silicon bond.

7. The device of claim 1, wherein a bonding strength between the first bonding layer and the second bonding layer is greater than two Joules per square meter to enable direct bonding of the first semiconductor device and the second semiconductor device.

8. A device, comprising:
   a first semiconductor device;
   a first bonding layer on a top surface of the first semiconductor device;
   a second semiconductor device; and
   a second bonding layer on a top surface of the second semiconductor device,
   wherein the first bonding layer is bonded to the second bonding layer, and
   wherein at least one of the first bonding layer or the second bonding layer has a surface roughness of less than 1 angstrom.

9. The device of claim 8, wherein at least one of:
   the first bonding layer is on a top surface of a first passivation layer of the first semiconductor device, or
   the second bonding layer is on a top surface of a second passivation layer of the second semiconductor device.

10. The device of claim 8, wherein at least one of the first bonding layer or the second bonding layer has a bonding strength of 2.5 Joules per square meter.

11. The device of claim 8, wherein at least one of the first bonding layer or the second bonding layer does not contain water.

12. The device of claim 8, wherein each of the first semiconductor device and the second semiconductor device comprises metal contacts.

13. The device of claim 12, wherein at least one metal contact, of metal contacts of the first semiconductor device, resides over at least one metal contact of the metal contacts of the second semiconductor device.

14. The device of claim 12, wherein at least one of:
   the metal contacts of the first semiconductor device reside in an undoped silicate glass (USG) layer of the first semiconductor device, or
   the metal contacts of the second semiconductor device reside in an intermetal dielectric (IMD) layer of the second semiconductor device.

15. A device, comprising:
   a first semiconductor device comprising a first passivation layer;
   a first bonding layer on a top surface of the first passivation layer;
   a second semiconductor device comprising a second passivation layer;
   a second bonding layer, on a top surface of the second passivation layer, bonded to the first bonding layer; and
   metal vias formed through the first passivation layer, the first bonding layer, the second passivation layer, and the second bonding layer,
   wherein at least one of the followings:
      the metal vias are formed through a portion of n undoped silicate glass (USG) layer of the first semiconductor device,
      the metal vias are formed through s portion of an intermetal dielectric (IMD) layer of the second semiconductor device, or
      the metal vias are further formed through a third passivation layer on the second semiconductor device.

16. The device of claim 15, wherein the first semiconductor device comprises first metal contacts and the second semiconductor device comprises second metal contacts, and wherein the metal vias are further formed through the first metal contacts and the second metal contacts.

17. The device of claim 15, wherein the metal vias are formed through the portion of the USG layer.

18. The device of claim 15, wherein the metal vias are formed through the portion of the IMD layer.

19. The device of claim 15, wherein the metal vias are further formed through the third passivation layer.

20. The device of claim 19, further comprising:
   third metal contacts on the third passivation layer.

* * * * *